(12) United States Patent
Freund

(10) Patent No.: US 7,675,955 B2
(45) Date of Patent: Mar. 9, 2010

(54) LASER ASSEMBLY FOR MULTI-LASER APPLICATIONS

(75) Inventor: Joseph Michael Freund, Fogelsville, PA (US)

(73) Assignee: Agere Systems Inc., Allentown, PA (US)

( * ) Notice: Subject to any disclaimer, the term of this patent is extended or adjusted under 35 U.S.C. 154(b) by 114 days.

(21) Appl. No.: 11/457,850

(22) Filed: Jul. 17, 2006

(65) Prior Publication Data

US 2008/0013584 A1    Jan. 17, 2008

(51) Int. Cl.
*H01S 5/00* (2006.01)
(52) U.S. Cl. .............. 372/50.124; 372/43.01; 372/50.1; 372/50.12
(58) Field of Classification Search .......... 372/43.01, 372/50.1, 50.12, 50.124, 75
See application file for complete search history.

(56) References Cited

U.S. PATENT DOCUMENTS

| | | | |
|---|---|---|---|
| 4,137,123 A | | 1/1979 | Bailey et al. |
| 4,995,045 A | * | 2/1991 | Burley et al. ............. 372/38.09 |
| 6,038,204 A | * | 3/2000 | Yang et al. .................. 369/121 |
| 6,469,843 B2 | | 10/2002 | Meyers |
| 6,487,224 B1 | * | 11/2002 | Ohashi et al. ............ 372/43.01 |
| 6,541,696 B2 | | 4/2003 | Washio |
| 6,937,406 B2 | | 8/2005 | Matsushima et al. |
| 2002/0039343 A1 | * | 4/2002 | Shindo .................. 369/112.29 |

FOREIGN PATENT DOCUMENTS

JP    2002-133869    *    5/2000

OTHER PUBLICATIONS

A. Yoshikawa et al., "Laser-Detector-Hologram Unit for Thin Optical Pick-Up Head of a CD Player," IEEE Transactions on Components, Packaging, and Manufacturing Technology, Part B, vol. 18, No. 2, pp. 245-249, May 1995.

* cited by examiner

*Primary Examiner*—Minsun Harvey
*Assistant Examiner*—Xnning Niu
(74) *Attorney, Agent, or Firm*—Ryan, Mason & Lewis, LLP

(57) ABSTRACT

A laser assembly comprises a substrate and two or more lasers. The substrate has a substantially planar surface region and a raised feature. The raised feature comprises two or more reflective surfaces. Each of the two or more lasers is mounted to the substantially planar surface region and is configured to emit a laser beam directed towards the raised feature at a nonzero tilt angle in relation to the substantially planar surface region.

19 Claims, 5 Drawing Sheets

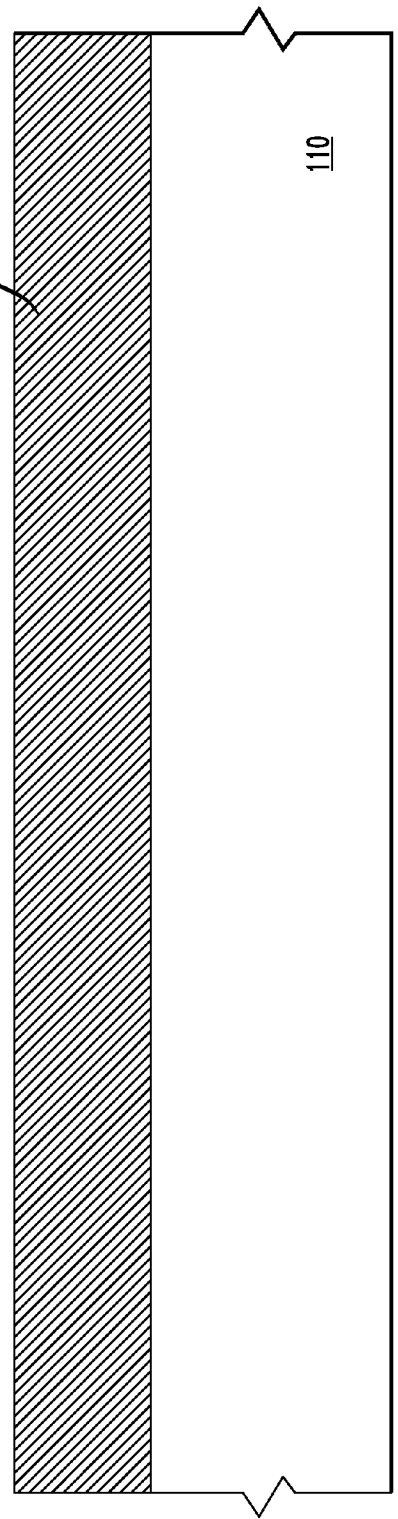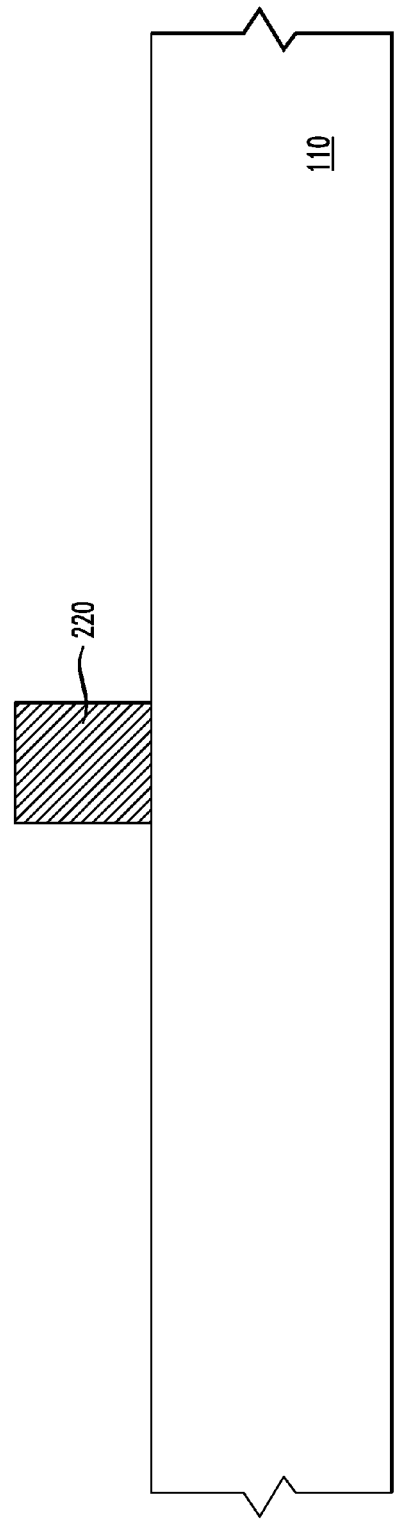
FIG. 3
FIG. 4

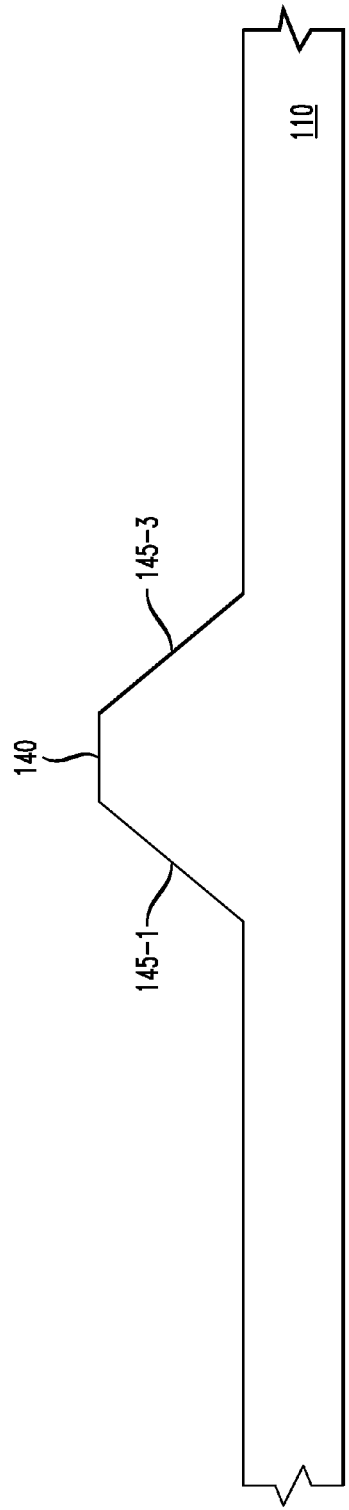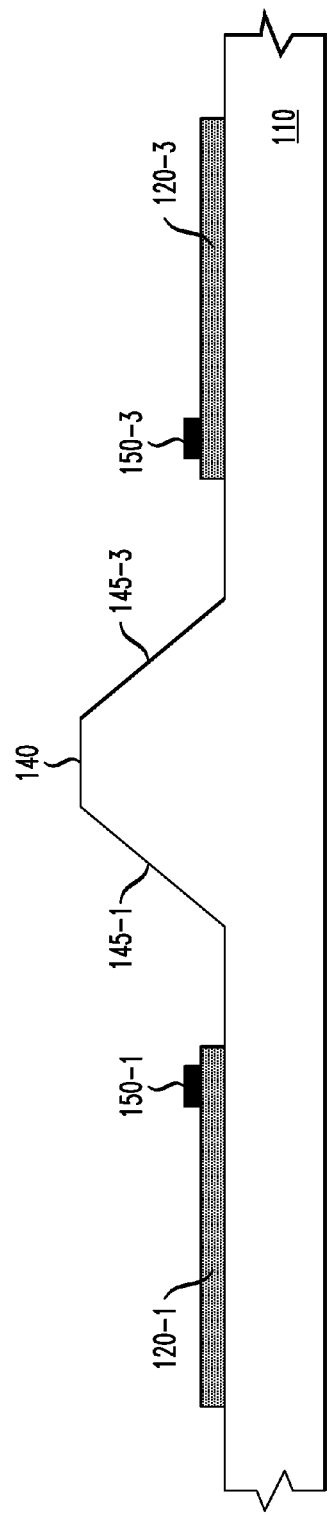

LASER ASSEMBLY FOR MULTI-LASER APPLICATIONS

FIELD OF THE INVENTION

This invention relates generally to laser assemblies and, more particularly, to laser assemblies comprising multiple lasers.

BACKGROUND OF THE INVENTION

In recent years, it has become increasingly more desirable to be able to integrate more than one semiconductor laser into a single optical device. For example, various different optical disc formats such as compact disc (CD), digital versatile disc (DVD) and Blu-ray Disc™ have become popular for recording digital data and entertainment. Nevertheless, each of these optical disc formats requires a different wavelength of semiconductor laser for its implementation. Therefore, forming an optical disc drive capable of reading and writing to more than one format of optical disc requires that two or more semiconductor lasers be included in a single optical disc drive.

What is more, laser printers typically utilize a single semiconductor laser to form images on a photoreceptor drum so that the images can subsequently be transferred to paper. The speed that a laser printer can print a page is generally a function of the output power of its semiconductor laser. The higher the laser output power, the faster the print speed. As a result, it is advantageous to combine the output powers of more than one semiconductor laser in a laser printer in order to increase print speed.

An optical device such as an optical disc drive or laser printer typically uses a set of steering optics to direct the output of its semiconductor laser to its respective target (e.g., optical disc media or photoreceptor drum). Such steering optics may comprise, for example, fixed and movable mirrors, prisms, gratings and lenses. In those optical devices where more than one semiconductor laser is to be employed, it is generally beneficial to have a single set of steering optics for all of the semiconductor lasers rather than a separate set of steering optics for each semiconductor laser. Having a single set of steering optics substantially reduces the complexity, size and cost of the optical device.

Implementing a single set of steering optics in a multi-laser optical device usually necessitates that the laser beams for the multiple lasers be brought into close proximity with one another and directed in substantially the same direction so as to mimic a laser beam emitted from a single laser source. For implementing two semiconductor lasers in a single optical device, U.S. Pat. No. 6,038,204, entitled "Optical Source Module for Generating Beams with Different Wavelengths," for example, describes a laser assembly comprising a silicon substrate having a patterned feature with a triangular cross-section located between two opposing semiconductor lasers that are mounted to the substrate. The laser beams of the two opposing semiconductor lasers are reflected by the oblique surfaces of the patterned feature so that the reflected laser beams approximate the light emitted from one laser. Nevertheless, despite the apparent simplicity of such a design, it is typically very difficult to pattern a triangular feature in a silicon substrate with oblique angles oriented 45 degrees in relation to the surface of substrate using conventional silicon substrates and processing techniques. Thus, such a laser assembly does not easily lend itself to mass production. In order to address this difficulty, U.S. Pat. No. 6,937,405, entitled "Optical Pickup Projecting Two Laser Beams from Apparently Approximated Light-Emitting Points," suggests positioning a discrete cube of silicon between two opposed semiconductor lasers such that the laser beams from the two semiconductor lasers reflect off two surfaces of the cube at 45 degree angles. Of course, such a solution adds considerable complexity and expense to the formation of the laser assembly. Moreover, neither one of the above solutions readily allows the optical coupling of the outputs from more than two lasers.

As a result, there is a need for a laser assembly that allows the laser beams from two or more lasers to approximate a laser beam emitted from a single laser source without the attendant disadvantages found in the prior art.

SUMMARY OF THE INVENTION

Embodiments of the present invention address the above-identified need by providing a laser assembly that allows the laser beams from two or more lasers to approximate a laser beam emitted from a single laser source. Advantageously such a laser assembly can be easily manufactured using conventional substrates and semiconductor processing techniques.

In accordance with an aspect of the invention, a laser assembly comprises a substrate and two or more lasers. The substrate has a substantially planar surface region and a raised feature. The raised feature comprises two or more reflective surfaces. Each of the two or more lasers is mounted to the substantially planar surface region and is configured to emit a laser beam directed towards the raised feature at a nonzero tilt angle in relation to the substantially planar surface region.

In an illustrative embodiment, a silicon substrate comprises a substantially planar surface region surrounding a raised feature. The raised feature, in turn, comprises four reflective surfaces that are angled at about 55 degrees in relation to the substantially planar surface region. Four edge-emitting semiconductor lasers are oriented such that each of their laser beams is reflected by a reflective surface. The semiconductor lasers are tilted upward by about ten degrees with respect to the substantially planar surface region through the use of novel block-shaped features in combination reflowed solder. This tilting of the semiconductor lasers allows the laser beams to be brought into close proximity with one another and to be reflected in a common direction that is substantially normal to the planar surface region of the substrate.

These and other features and advantages of the present invention will become apparent from the following detailed description which is to be read in conjunction with the accompanying figures.

BRIEF DESCRIPTION OF THE DRAWINGS

FIGS. 3-6 show sectional views of the FIG. 1 laser assembly during various stages of formation.

DETAILED DESCRIPTION OF THE INVENTION

This invention will be illustrated herein in conjunction with exemplary laser assemblies. It should be understood, however, that the invention is not limited to the particular types of lasers, arrangements, materials, films layers and processing steps shown and described herein. Modifications to the illustrative embodiments will become apparent to those skilled in the art.

It should also be understood that the various features shown in the accompanying figures may not be drawn to scale. Moreover, for economy of description, the figures are restricted to only those elements that are required to show aspects of the invention. In actual application, a laser assembly in accordance with aspects of the invention will likely contain more elements than those illustrated herein. These more extensive laser assemblies will still come within the scope of the invention.

Figure 1:
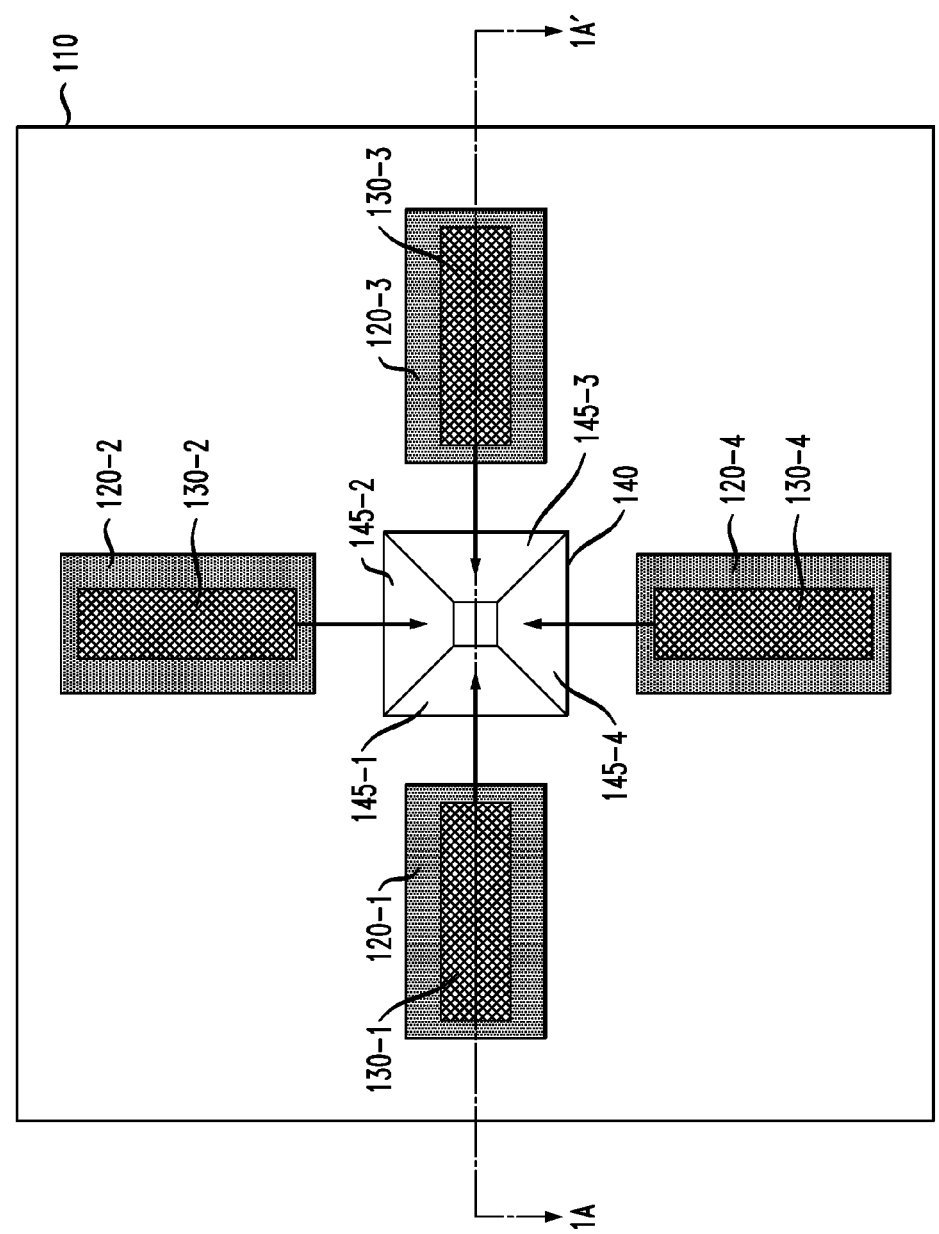
FIG. 1 shows a plan view of a laser assembly in accordance with an illustrative embodiment of the invention.
Figure 2:
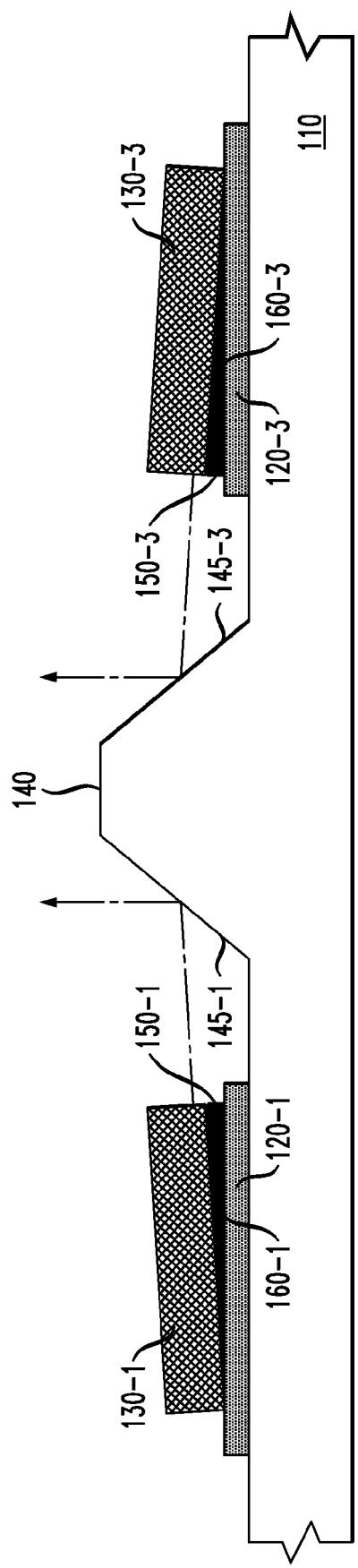
FIG. 2 shows a sectional view of the FIG. 1 laser assembly cut in the plane indicated in FIG. 1.

FIG. 1 shows a plan view of a laser assembly 100 in accordance with aspects of the invention. FIG. 2 shows a sectional view of the FIG. 1 laser assembly cut along the line 1A-1A' indicated in FIG. 1.

The laser assembly 100 includes a crystalline silicon substrate 110. The substrate comprises a substantially planar surface region on which are mounted four bond pads 120-i, where i=1, 2, 3, and 4. Four semiconductor lasers 130-i, in turn, are mounted on the bonds pad with their active sides closest to the substrate. A raised feature 140 is formed in the center of the substrate. The raised feature comprises four reflective surfaces 145-i.

In accordance with aspects of the invention, the semiconductor lasers 130-i are mounted such that they are tilted upward by about ten degrees with respect to the substantially planar surface region of the substrate 110. As shown in FIG. 2, this tilting is accomplished through the use of block features 150-i which act to lift one end of the each semiconductor laser. A quantity of solder 160-i lies between each semiconductor laser and its respective bond pad 120-i. The quantities of solder fill the space created by the tilt of the semiconductor lasers and act to secure the semiconductor lasers to their respective bond pads.

Each of the semiconductor lasers 130-i in the illustrative optical assembly 100 is an edge emitting semiconductor laser. The semiconductor lasers are oriented such that their laser beams strike and are reflected by the reflective surfaces 145-i of the raised feature 140. The raised feature thereby brings the laser beams emitted from the various semiconductor lasers into close proximity with one another and directs the lasers beams in substantially the same direction.

With regard to the illustrative embodiment shown in FIGS. 1 and 2, it should be noted that, while the illustrative laser assembly 100 comprises edge-emitting semiconductor lasers 130-i, other types of lasers could also be utilized and the resultant laser assembly would still come within the scope of the invention. For example, the laser beams could be vertical cavity surface emitting lasers that are oriented such that their emitted laser beams are directed toward the raised feature 140 (with any required tilt). Moreover, it should also be recognized that the semiconductor lasers in the illustrative embodiment require various control signals in order to function. These control signals are provided by additional wiring that is not explicitly shown in FIGS. 1 and 2, but will be familiar to one skilled in the art.

In the laser assembly 100, the semiconductor lasers 130-i are each about 500 micrometers long, which is typical for edge-emitting semiconductor lasers. In addition, the semiconductor lasers are located so that their emitting edges are located about 100 micrometers from the raised feature 140. With this configuration, the raised feature is preferably about 250 micrometers high. This height allows the laser beams emitted from the various semiconductor lasers to strike their respective reflective surfaces 145-i near the centers of these surfaces. Moreover, this height is readily achieved using the silicon substrates and semiconductor processing techniques described below.

The advantages of tilting the semiconductor lasers 130-i become apparent when one considers the properties of the raised feature 140. For ease of manufacture (described in greater detail below), the raised feature in the illustrative laser assembly 100 is preferably formed by the anisotropic etching of crystalline silicon with a <100> crystal plane orientation using conventional photolithography and anisotropic etching techniques. Because of the preferred method of manufacture, the substantially planar surface region of the substrate 110 continues to have a <100> crystal plane orientation, while the reflective surfaces 145-i each have a substantially <111> crystal plane orientation. This results in the angled surfaces being oriented with an angle characteristic of the anisotropic etching of <100> crystalline silicon, namely about 55 degrees.

If the semiconductor lasers 130-i were not tilted and the laser beams were emitted parallel to the substantially planar surface region of the substrate 110, each laser beam would strike their respective reflective surface 145-i with an angle of incidence equal to about 35 degrees. Because the angle of incidence typically equals the angle of reflectance, each laser beam would subsequently be reflected at an angle of about 70 degrees with respect to the substantially planar surface region. In other words, the laser beams would not be reflected normal to the substantially planar surface region. This would cause the laser beams to diverge from one another after being reflected.

Tilting the laser beams such that they travel from the semiconductor lasers 130-i to the reflective surfaces 145-i at a tilt angle of about ten degrees, on the other hand, compensates for the 55 degree angle of the reflective surfaces and causes the laser beams to strike their respective reflective surfaces at an angle of incidence equal to about 45 degrees. In this way, the laser beams from the various semiconductor lasers are each reflected at an angle approximately normal to the substantially planar surface region. Divergence of the laser beams after being reflected is thereby reduced and the laser beams approximate a laser beam emitted from a single laser source.

It should be noted that while the reflective surfaces 145-i will frequently have an angle of about 55 degrees in relation to the substantially planar surface region of the substrate 110, the invention is functional across a wide range of angles. More generally, if the reflective surfaces have an angle of x degrees in relation to the substantially planar surface region, the semiconductor lasers 130-i will preferably be tilted by about x minus 45 degrees. This configuration allows the laser beams emitted by the semiconductor lasers to be reflected by the raised feature 140 at an angle approximately normal to the substantially planar surface region.

The laser assembly 100 can be readily manufactured using conventional substrates and semiconductor processing techniques. FIGS. 3-6 show sectional views of the laser assembly 100 during various stages of formation. Initially a masking layer 210 is deposited on the silicon substrate 110, as shown in FIG. 3. Next, conventional photolithography and reactive ion etching (RIE) techniques are utilized to pattern the masking layer to form a masking feature 220 overlying the desired position of the raised feature 140. The resultant film stack is shown in FIG. 4.

As stated above, the substrate 110 preferably has a <100> crystal plane orientation. Advantageously, the current semiconductor industry predominantly uses silicon substrates with the <100> crystal plane orientation when manufacturing silicon-based semiconductor devices. Moreover, these commonly used silicon substrates typically have a thickness between about 700 and 750 micrometers. As a result, silicon substrates compatible with the present application are readily available from commercial suppliers and are relatively inexpensive compared to less frequently used substrate configurations.

In the next processing steps, the masked film stack is exposed to an anisotropic etch process. Such an anisotropic etch process relies on the fact that certain etchants tend to etch different crystal planes of crystalline silicon at substantially different etch rates. For example, potassium hydroxide (KOH) etches the <100> crystal plane of silicon about 400 times faster than it etches the <111> crystal plane of silicon. As a result, the present anisotropic etch process may be accomplished by exposing the film stack to a wet solution comprising KOH, such as a solution of KOH, ethylene glycol and water. As an alternative to KOH, ethylene diamine pyrocatechol (EDP) may be used to selectively etch silicon. In addition there are several other selective etchants for crystalline silicon that will be known to one skilled in the art and will come within the scope of the invention.

The anisotropic etch process removes silicon where the masking layer is not present. In order to stand up to the anisotropic etch process, it is preferable to form the masking feature 220 out of a dielectric material such as silicon dioxide or silicon nitride. Both of these materials display slow etch rates in both KOH and EDP. After anisotropically etching the film stack and removing the masking feature, the film stack appears as shown in FIG. 5. It will be observed that the anisotropic etch process forms the raised feature 140 of the laser assembly 100 with its four reflective surfaces 145-i. The height of the raised feature will largely be function of the duration of the anisotropic etch process.

At this point in the process, the raised feature 140 may optionally be coated with a reflective coating to aid in efficiently reflecting the laser beams. This reflective coating may comprise, for example, a thin layer of gold deposited on a thin layer of titanium. The titanium acts to adhere the gold to the silicon, while the gold acts as a good reflector. Nonetheless, this combination of materials is just one possibility. It is also contemplated that other materials may be used for the reflective coating such as, but not limited to, silver and aluminum.

Subsequently, the bond pads 120-i may be formed by depositing a blanket layer of bond pad material on the film stack and then using conventional photolithography and RIE techniques to pattern the bond pad material into the discrete bond pads. The block features 150-i may then be formed, also by conventional deposition, photolithography and RIE. After forming the bond pads and block features, the assembly will appear as shown in FIG. 6. The bond pads and block features will preferably comprise gold, silver or copper, but other suitable materials may also be utilized. If the semiconductor lasers 130-i have a length of about 500 micrometers, the block feature will have a height of about 80 micrometers in order to tilt the semiconductor lasers by about ten degrees.

As described earlier, attachment of the semiconductor lasers 130-i to the bond pads 120-i is accomplished using quantities of solder material 160-i. This attachment may be readily accomplished through, for example, the use of conventional solder preforms. A solder preform is a prefabricated piece of solder alloy that can take a number of varying shapes (e.g., ribbons, disks and pellets). The particular shape can be customized to the specific application.

A semiconductor laser 130-i is affixed to its bond pad 120-i by positioning a solder preform between the semiconductor laser and the bond pad and by applying heat to reflow the solder preform. Heat can be applied to the assembly by, for example, running the assembly through a tunnel furnace. The temperature required for the solder material's reflow will depend on the particular type of solder material utilized, but will typically be between 180 and 360 degrees Celsius. The chosen solder material will preferably be one that adheres well to both the bond pads and the semiconductor lasers. The solder material may, for example, comprise a tin-lead alloy like that conventionally used in integrated circuit packaging technology (e.g., Sn63/Pb37 and Pb90/Sn10), or, alternatively, may comprise many other types of lead-free alloys (e.g., Sn96.5/Ag3.5, Sn90/Ag90 and Au88/Ge12).

Once the semiconductor lasers 130-i are attached to the assembly shown in FIG. 6, the assembly will appear identical to the laser assembly 100 shown in FIGS. 1 and 2. At this point, the electrical connections to the semiconductor lasers can be made (not shown) using conventional wiring techniques.

Figure 7:
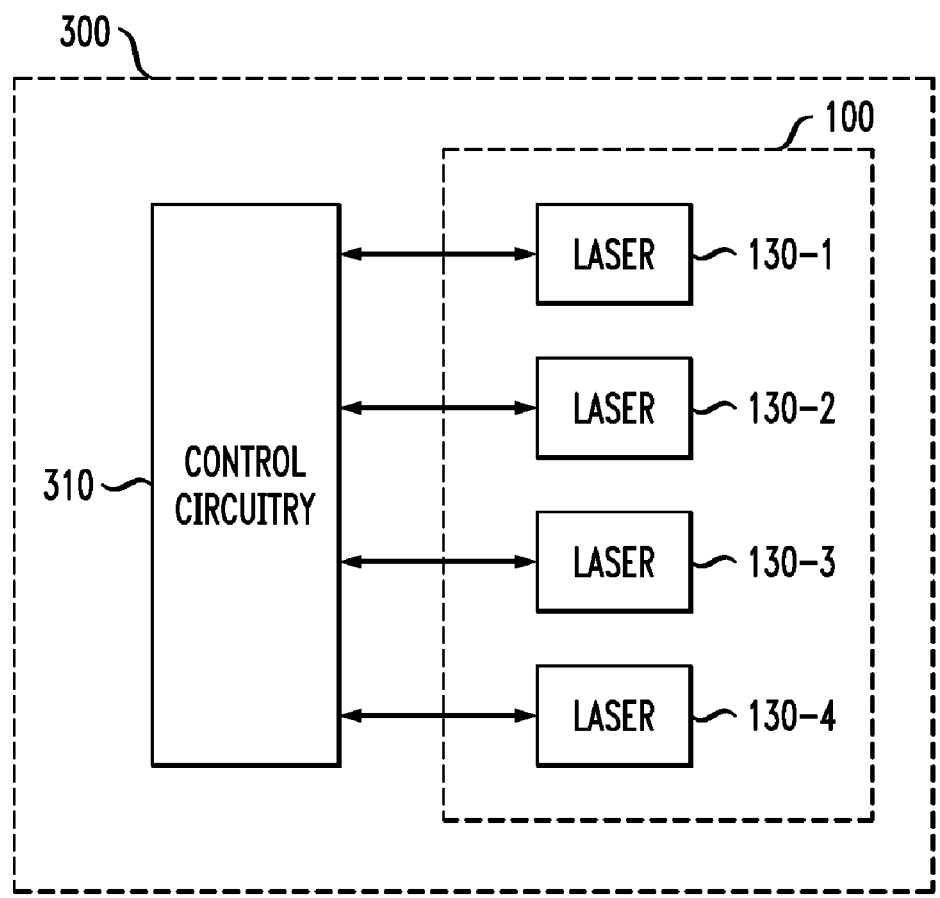
FIG. 7 shows a block diagram of an illustrative optical device comprising the FIG. 1 laser assembly.

FIG. 7 shows a block diagram of the implementation of the laser assembly 100 in an optical device 300 in accordance with an illustrative embodiment of the invention. In addition to the laser assembly, the optical device further comprises control circuitry 310. The operation of the semiconductor lasers 130-i in the optical device is largely conventional and will be familiar to one skilled in the art. Moreover, the operation of semiconductor lasers is described in detail in a number of readily available references such as, for example, P. Holloway et al., *Handbook of Compound Semiconductors*, William Andrews Inc., 1996, and E. Kapon, *Semiconductor Lasers II*, Elsevier, 1998, which are incorporated herein by reference.

The semiconductor lasers 130-i are powered through the application of an electrical control voltage. Generally, the greater the magnitude of applied control voltage, the greater the amount of light output. In the optical device 300, it is the control circuitry 310 that applies the control voltage to the semiconductor lasers. Precise laser output power may optionally be maintained through the use of one or more monitor photodiodes that measure the output power of the semiconductor lasers and feed this measurement back to the control circuitry. The control circuitry may be a discrete portion of circuitry within the optical device or may be, in contrast, integrated into the device's other circuitry.

The semiconductor lasers 130-i in a multi-laser assembly such as laser assembly 100 may emit light at the same wavelength or may emit light at different wavelengths, or a combination thereof. As stated before, a multi-laser assembly may be useful in an optical storage drive capable of recording and playing back data in accordance with several optical disc formats such as CD, DVD and Blu-ray DiSc™. Such a multi-laser assembly would utilize semiconductor lasers that emit light at different wavelengths from each other. Blu-ray Disc™ is a relatively new optical disc format capable of recording and playing back high-definition content from, for instance, high definition broadcasting. Semiconductor lasers for Blu-ray Disc™ applications typically emit at a wavelength of 405 nanometers. Semiconductor lasers for DVD and CD applications typically emit at wavelengths of 660 and 785 nanometers, respectively.

In addition, it may be desirable to have the semiconductor lasers 130-i emit at the same wavelength and to combine their outputs for certain high power applications. A multi-laser assembly in accordance with aspects of the invention, therefore, is useful for creating laser beams with greater power than that which can be generated by any single semiconductor laser alone. As stated before, such a multi-laser assembly may be useful in printers and, moreover, may also be useful in other applications like those involving, for example, fiber optic communications.

Importantly, it is to be understood that, although illustrative embodiments of the present invention have been described herein with reference to the accompanying figures, the invention is not limited to those precise embodiments. For example, the particular lasers, mounting structures, circuitry and other characteristics described herein may be varied in other embodiments. One skilled in the art will recognize various other changes and modifications that may be made without departing from the scope of the appended claims.

What is claimed is:

1. A laser assembly comprising:
    a substrate, the substrate having a substantially planar surface region and a raised feature, the raised feature comprising two or more reflective surfaces;
    two or more lasers, each of the two or more lasers mounted to the substantially planar surface region and configured to emit a laser beam directed towards the raised feature at a nonzero tilt angle in relation to the substantially planar surface region; and
    block features for respective ones of the two or more lasers, each block feature being disposed between its respective laser and the substantially planar surface region and being operative to tilt its respective laser in relation to the substantially planar surface region;
    wherein the block features are configured to provide tilt angles for the respective lasers that offset respective differences between actual angles of the respective reflective surfaces and angles of such reflective surfaces which would otherwise be required to ensure that the laser beams are reflected by the respective reflective surfaces at angles substantially normal to the substantially planar surface region.

2. The laser assembly of claim 1, wherein the tilt angle of the two or more lasers is configured to cause the laser beams to be reflected by the raised feature at an angle substantially normal to the substantially planar surface region.

3. The laser assembly of claim 1, wherein the two or more reflective surfaces are oriented by x degrees in relation to the substantially planar surface region, and the two or more lasers are tilted by about x minus 45 degrees in relation to the substantially planar surface region.

4. The laser assembly of claim 1, wherein the two or more reflective surfaces are oriented by about 55 degrees in relation to the substantially planar surface region.

5. The laser assembly of claim 1, wherein the two or more lasers comprise edge-emitting semiconductor lasers.

6. The laser assembly of claim 1, further comprising a quantity of solder material, the quantity of solder material being operative to at least partially mount at least one of the two or more lasers to the substantially planar surface region.

7. The laser assembly of claim 1, wherein the raised feature has three or more reflective surfaces.

8. The laser assembly of claim 1, where in the laser assembly comprises three or more lasers.

9. The laser assembly of claim 1, wherein the substantially planar surface region comprises crystalline silicon having a substantially <100> crystal plane orientation.

10. The laser assembly of claim 1, wherein the two or more reflective surfaces comprise crystalline silicon having a substantially <111> crystal plane orientation.

11. The laser assembly of claim 1, wherein the two or more reflective surfaces are coated with a reflective material.

12. An apparatus including:
    a laser assembly, the laser assembly comprising:
        a substrate, the substrate having a substantially planar surface region and a raised feature, the raised feature comprising two or more reflective surfaces;
        two or more lasers, each of the two or more lasers mounted to the substantially planar surface region and configured to emit a laser beam directed towards the raised feature at a nonzero tilt angle in relation to the substantially planar surface region; and
        block features for respective ones of the two or more lasers, each block feature being disposed between its respective laser and the substantially planar surface region and being operative to tilt its respective laser in relation to the substantially planar surface region;
        wherein the block features are configured to provide tilt angles for the respective lasers that offset respective differences between actual angles of the respective reflective surfaces and angles of such reflective surfaces which would otherwise be required to ensure that the laser beams are reflected by the respective reflective surfaces at angles substantially normal to the substantially planar surface region; and
    control circuitry coupled to the two or more lasers, the control circuitry operative to control the two or more lasers.

13. The apparatus of claim 12, wherein at least two of the two or more lasers emit at different wavelengths from each other.

14. The apparatus of claim 12, wherein at least two of the two or more lasers emit at the same wavelength as each other.

15. The apparatus of claim 12, wherein the apparatus comprises an optical disc drive or printer.

16. A method of forming a laser assembly, the method comprising the steps of:
    forming a substrate, the substrate having a substantially planar surface region and a raised feature, the raised feature comprising two or more reflective surfaces;
    forming two or more lasers adapted for mounting to the substantially planar surface region, each of the two or more lasers configured to emit a laser beam directed towards the raised feature at a nonzero tilt angle in relation to the substantially planar surface region; and
    forming block features for respective ones of the two or more lasers, each block feature being disposed between its respective laser and the substantially planar surface region and being operative to tilt its respective laser in relation to the substantially planar surface region;
    wherein the block features are configured to provide tilt angles for the respective lasers that offset respective differences between actual angles of the respective reflective surfaces and angles of such reflective surfaces which would otherwise be required to ensure that the laser beams are reflected by the respective reflective surfaces at angles substantially normal to the substantially planar surface region.

17. The method of claim 16, wherein the step of forming the substrate comprises anisotropic etching.

18. The method of claim 17, wherein the anisotropic etching includes exposing crystalline silicon to a solution comprising potassium hydroxide or ethylene diamine pyrocatechol.

19. The method of claim 16, wherein the two or more lasers are mounted to the substantially planar surface region utilizing a process that comprises reflowing solder material.

* * * * *